(12) United States Patent
Yanagisawa et al.

(10) Patent No.: US 7,808,750 B2
(45) Date of Patent: Oct. 5, 2010

(54) THIN-FILM MAGNETIC HEAD COMPRISING MAGNETO-RESISTIVE EFFECT DEVICE, AND HARD DISK SYSTEM

(75) Inventors: Takumi Yanagisawa, Tokyo (JP); Takayasu Kanaya, Tokyo (JP)

(73) Assignee: TDK Corporation, Tokyo (JP)

( * ) Notice: Subject to any disclaimer, the term of this patent is extended or adjusted under 35 U.S.C. 154(b) by 677 days.

(21) Appl. No.: 11/831,451

(22) Filed: Jul. 31, 2007

(65) Prior Publication Data

US 2009/0034129 A1 Feb. 5, 2009

(51) Int. Cl.
*G11B 5/39* (2006.01)
*G11B 5/127* (2006.01)

(52) U.S. Cl. .............................. 360/324.12; 360/324.1

(58) Field of Classification Search ....... 360/324–324.2
See application file for complete search history.

(56) References Cited

U.S. PATENT DOCUMENTS

| 6,636,395 | B1 * | 10/2003 | Terunuma | 360/324.11 |
|---|---|---|---|---|
| 7,231,705 | B2 * | 6/2007 | Kagami et al. | 29/603.15 |
| 7,440,241 | B2 * | 10/2008 | Hoshino et al. | 360/324.12 |
| 2004/0061986 | A1 * | 4/2004 | Kagami et al. | 360/324.11 |
| 2006/0158789 | A1 * | 7/2006 | Koyama et al. | 360/321 |
| 2007/0206333 | A1 * | 9/2007 | Watanabe et al. | 360/313 |
| 2008/0013223 | A1 * | 1/2008 | Miyauchi et al. | 360/324.11 |
| 2009/0034133 | A1 * | 2/2009 | Miyauchi et al. | 360/324 |

FOREIGN PATENT DOCUMENTS

| JP | 8-147633 | 6/1996 |
|---|---|---|
| JP | 2005-38556 | 2/2005 |
| JP | 2005-251254 | 9/2005 |

* cited by examiner

*Primary Examiner*—William J Klimowicz
(74) *Attorney, Agent, or Firm*—Oblon, Spivak, McClelland, Maier & Neustadt, L.L.P.

(57) ABSTRACT

The thin-film magnetic head of the invention comprises a magneto-resistive effect device including a multilayer film and a bias mechanism portion including a bias magnetic field-applying layer formed on each widthwise end of the multilayer film. When the magneto-resistive effective device including a multilayer film and the bias mechanism portion are viewed in plane on their own, the uppermost extremity of the rear end of the magneto-resistive effect device and the uppermost extremity of the rear end of the bias mechanism portion lie at substantially the same depth-wise position, and the rear slant of the bias mechanism portion is gentler in gradient than the rear slat of the magneto-resistive effect device. It is thus possible just only to facilitate the fabrication of the device but also to achieve several advantages of being a lower rate of occurrence of noise, higher reliability and higher yields.

8 Claims, 11 Drawing Sheets

THIN-FILM MAGNETIC HEAD COMPRISING MAGNETO-RESISTIVE EFFECT DEVICE, AND HARD DISK SYSTEM

BACKGROUND OF THE INVENTION

1. Field of the Invention

The present invention relates to a thin-film magnetic head comprising a magneto-resistive effect device for reading the magnetic field strength of a magnetic recording medium or the like as signals, and a head gimbal assembly and a magnetic disk system, each comprising that thin-film magnetic head.

2. Explanation of the Prior Art

In recent years, with an increase in the plane recording density of magnetic disk systems, there have been growing demands for improvements in the performance of thin-film magnetic heads. For the thin-film magnetic head, a composite type thin-film magnetic head has been widely used, which has a structure wherein a reproducing head having a read-only magneto-resistive effect device (hereinafter often called the MR device) and a recording head having a write-only induction type magnetic device are stacked together.

The MR device, for instance, includes an AMR device harnessing the anisotropic magneto-resistive effect, a GMR device making use of the giant magneto-resistive effect, and a TMR device taking advantage of the tunnel-type magneto-resistive effect.

Requirements for reproducing heads, among other, are high sensitivity and high output. For reproducing heads meeting such requirements, GMR heads using a spin valve type GMR device have already been mass produced.

Further, GMR devices of the structure with sense currents flowing perpendicularly to the plane of each of their constituting layers, viz., GMR devices of the CPP (current perpendicular to plane) structure (CPP-MR devices), too, are now under development as coming-generation ones. TMR devices now in full commercial production and practical use, too, fall under the category of CPP-MR devices.

In a thin-film magnetic head comprising such a magneto-resistive effect device, there are two bias magnetic field-applying layers provided, one on each side of the magneto-resistive effect device. By way of these bias magnetic field-applying layers, the so-called longitudinal bias is applied to the device so that a given external magnetic field can be detected while noises are staved off.

Referring here to a thin-film magnetic head comprising a prior art magneto-resistive effect device, FIGS. 14 and 15 are illustrative of in what relations the rear end of the magneto-resistive effect device and the rear end of a bias mechanism portion including bias magnetic field-applying layers are positioned. FIG. 14 is illustrative in plane of in what states a conventional magneto-resistive effect device 505 and a prior art bias mechanism portion 506 are disposed, and FIG. 15 is a plan view of another prior art example illustrative of in what states the magneto-resistive effect device 505 and bias mechanism portion 506 are positioned.

(1) As shown in the plan view of FIG. 14, the rear end 505a of the magneto-resistive effect device 505 and the rear end 506a of the bias mechanism portion 506 have been processed by Ar ion milling, using a mask prepared in such a way as to bring that rear end 505a in alignment with that rear end 505b; and (2) as shown in the plan view of FIG. 15, the rear end 505a of the magneto-resistive effect device 505 and the rear end 506a of the bias mechanism portion 506 have been processed while the length of the bias mechanism portion 506 out to the rear end 506a is much longer than the length of the magneto-resistive effect device 505 out to the rear end 505a (the so-called wide type of bias mechanism portion), so that the rear end 506a of the bias mechanism portion 506 is positioned more on the depth-wise side than the rear end 505a of the magneto-resistive effect device 505.

In the aforesaid case (1), it is likely that the taper angle of the rear end 506a of the bias mechanism portion 506 that inclines in its thickness direction (the depth-wise direction of the sheet of FIG. 14) may be equal to or larger (more precipitous) than the taper angle of the rear end 505a of the magneto-resistive effect device 505. Therefore, no large enough bias magnetic field can likely be applied to near the rear end 505a of the magneto-resistive effect device 505 that is an unsteady magnetization area (the rear end of a free layer in particular). Consequently, there is inconvenience of magnetic noises being likely to occur.

In the aforesaid case (2), a large enough bias magnetic field can be applied to near the rear end 505a of the magneto-resistive effect device 505 that is an unsteady magnetization area (the rear end of a free layer in particular), too, so that noises can be controlled. In the case (2), however, it is required that the rear end 505a of the magneto-resistive effect device 505 and the rear end 506a of the bias mechanism portion 506 be independently formed. This means that there is the need of readying up two process steps for the formation of those rear ends, making the process involved awkward. Moreover, for that process high position precision is needed because of a change in the bias strength depending on the relative position of the magneto-resistive effect device 505 and bias mechanism portion 506.

The situation being like this, an object of the invention is to provide a thin-film magnetic head comprising a magneto-resistive effect device, which is fabricated in an easier manner, enables the rate of occurrence of noises to be kept lower, and makes sure higher reliability and fabrication yields.

SUMMARY OF THE INVENTION

According to the invention, the aforesaid object is accomplished by the provision of a thin-film magnetic head comprising a magneto-resistive effect device including a multilayer film in which a fixed magnetization layer, a nonmagnetic layer and a free layer stacked together in order, and a bias mechanism portion including a bias magnetic field-applying layer formed on each widthwise end of the multilayer film, wherein said free layer functions such that the direction of magnetization changes depending on an external magnetic field; said bias magnetic field-applying layer functions in such a way as to apply a longitudinal magnetic field to said free layer; said magneto-resistive effect device including a multilayer film extends rearward from an air bearing surface that is a plane opposite to a medium, and is provided at a rear end thereof with a rear slant (PS) that inclines from the uppermost extremity (P1) of the rear end of the device toward the lowermost extremity (P2) of the rear end of the device in a thickness direction; said bias mechanism portion extends rearward from the air bearing surface that is the plane opposite to the medium, and is provided at a rear end thereof with a rear slant (BS) that inclines from the uppermost extremity (B1) of the rear end of the bias mechanism portion toward the lowermost extremity (B2) of the rear end of the bias mechanism portion in a thickness direction; and said rear slant (BS) of the bias mechanism portion is gentler in gradient than said rear slant (PS) of said magneto-resistive effect device.

In a preferable embodiment of the thin-film magnetic head according to the invention, the rear slant (BS) of the bias mechanism portion is formed such that the thickness (H1) of the bias magnetic field-applying layer found at the same position as a depth-wise position (Y2) at which the lowermost extremity (F2) of the free layer at said rear slant (PS) of the magneto-resistive effect device lies accounts for at least 70% of the total thickness (H0) of the bias mechanism portion.

In another preferable embodiment of the thin-film magnetic head according to the invention, when said magneto-resistive effect device including a multilayer layer and said bias mechanism portion are viewed in plane, said uppermost extremity (P1) of the rear end of the magneto-resistive effect device and said uppermost extremity (B1) of the rear end of the bias mechanism portion lie at substantially the same depth-wise position.

In yet another preferable embodiment of the thin-film magnetic head according to the invention, the depth-wise position (Y1) of said uppermost extremity (P1) of the rear end of the magneto-resistive effect device, and said uppermost extremity (B1) of the rear end of the bias mechanism portion is in the range of ±3% with respect to a predetermined depth-wise length.

In a preferable embodiment of the thin-film magnetic head according to the invention, the condition: $Tb-Tp \leq 13$ nm is satisfied, where Tb is the maximum thickness of said bias mechanism portion, and Tp is the thickness of said magneto-resistive effect device.

The invention also provides a head gimbal assembly that comprises a slider including the aforesaid thin-film magnetic head and located in opposition to a recording medium, and a suspension adapted to resiliently support said slider.

Moreover, the invention provides a magnetic disk system that comprises a slider including the aforesaid thin-film magnetic head and located in opposition to a recording medium, and a positioning means adapted to support and position said slider with respect to said recording medium.

DETAILED EXPLANATION OF THE INVENTION

The best mode for carrying out the invention is now explained in details.

Figure 1:
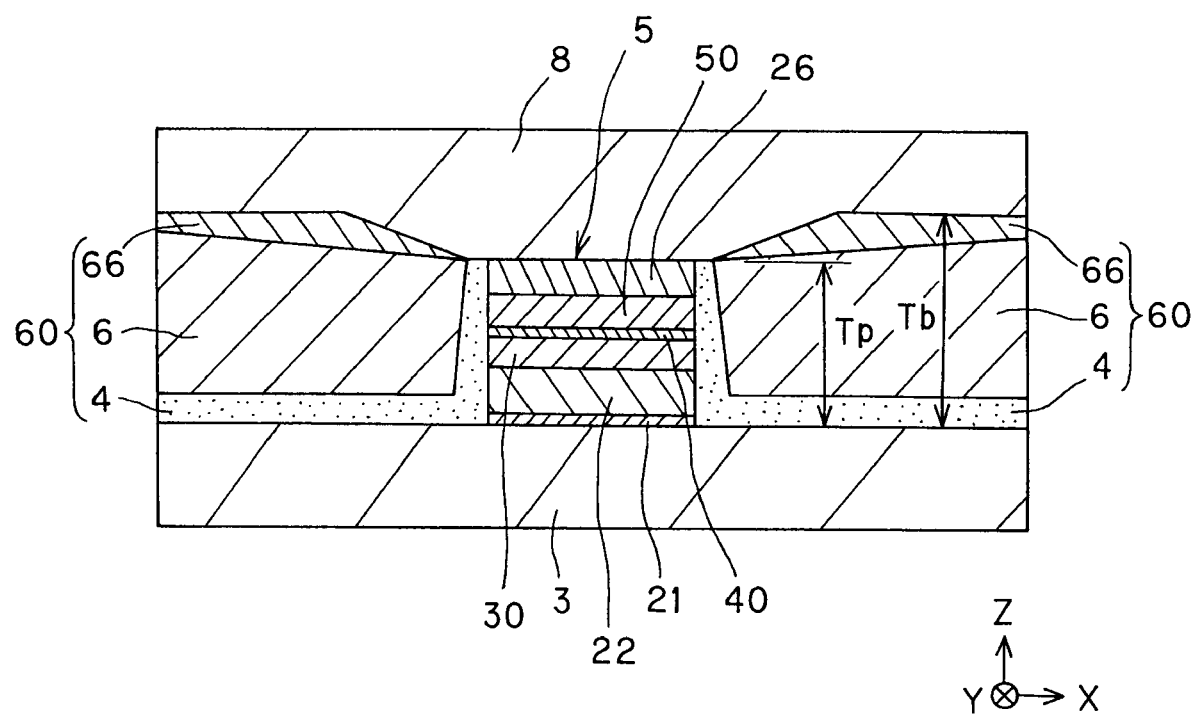
FIG. 1 is a sectional view illustrative of a section of the reproducing head primarily parallel with the medium opposite plane in an embodiment of the invention.

FIG. 1 is illustrative of the ABS (air bearing surface) of a reproducing head in an embodiment of the invention. The abbreviation "ABS" is generally corresponding to a plane (hereinafter often called the medium opposite plane) at which the reproducing head is in opposition to a recording medium; however, it is understood that the ABS here includes even a section at a position where the multilayer structure of the device can be clearly observed. For instance, a protective layer such as DLC (the protective layer adapted to cover the device), in a strict sense, positioned at the medium opposite plane may be factored out, if necessary.

Figure 2:
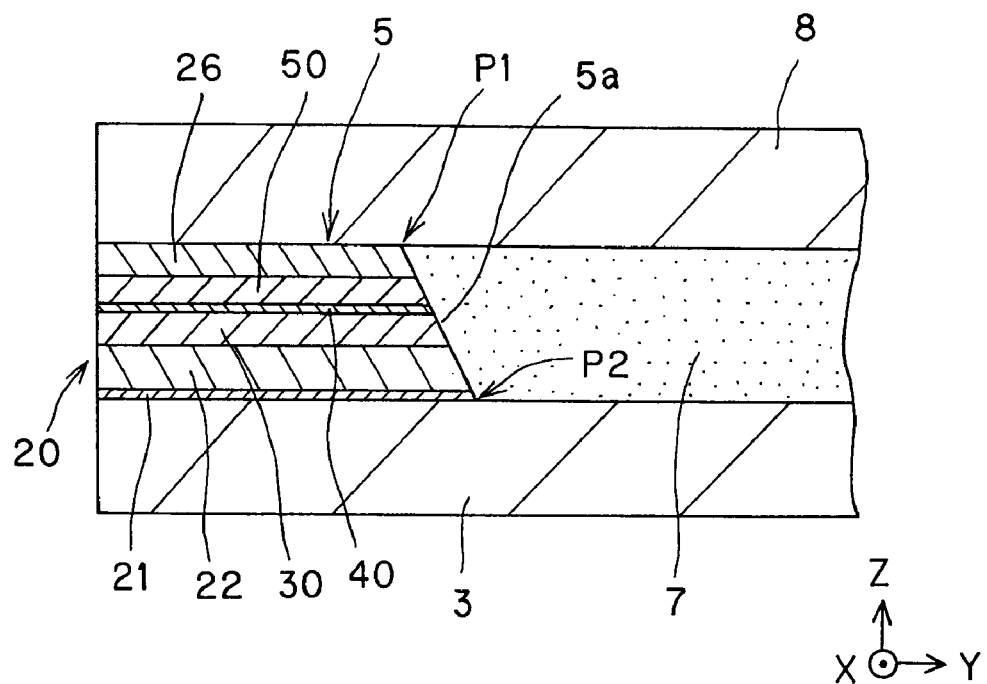
FIG. 2 is illustrative in longitudinal section and in schematic of FIG. 1.
Figure 3:
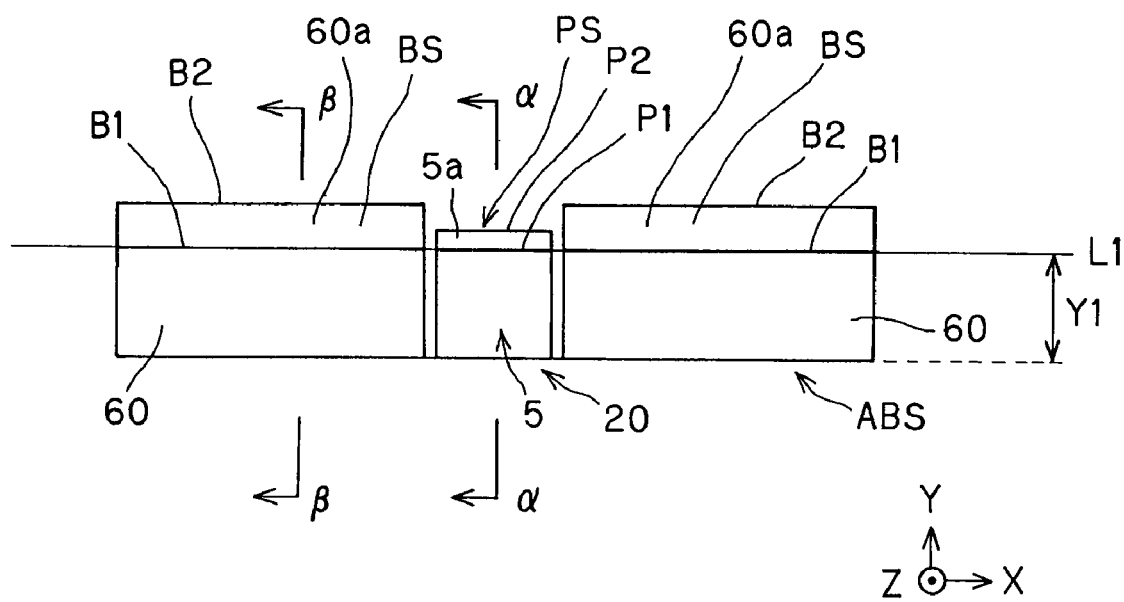
FIG. 3 is a plan view illustrative of in what state the magneto-resistive effect device and the bias mechanism portion are positioned.
Figure 4A:
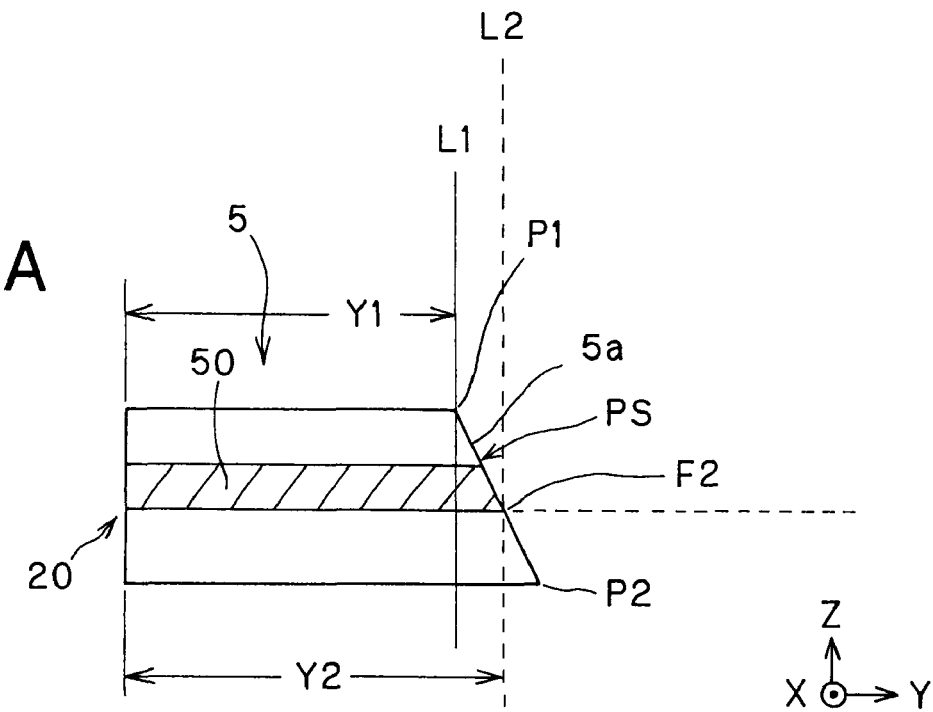
FIG. 4A is a sectional view taken on α-α of FIG. 3 (illustrative of a section of the magneto-resistive effect device).
Figure 4B:
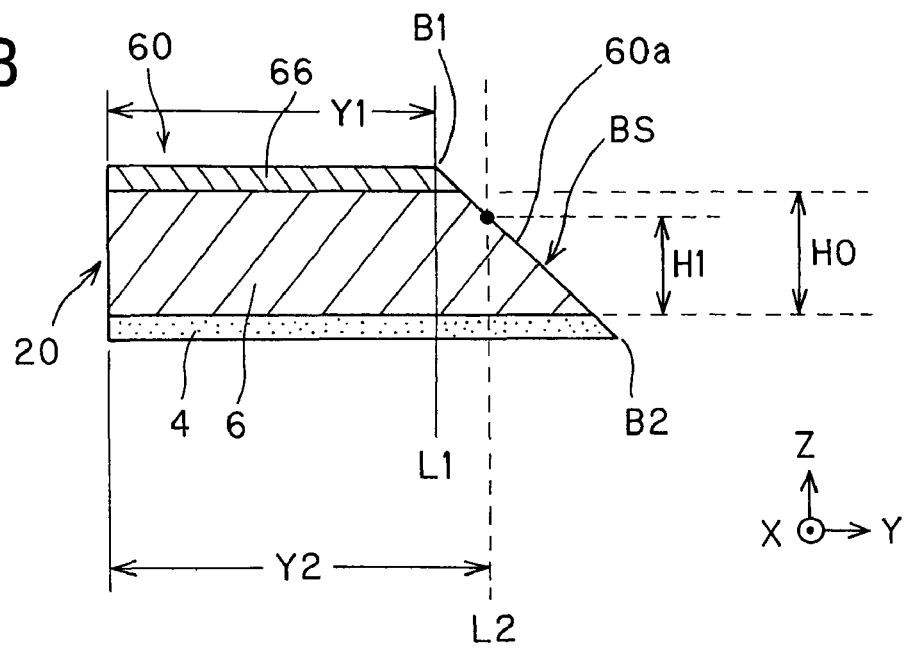
FIG. 4B is a sectional view taken on β-β of FIG. 3 (illustrative of a section of the bias mechanism portion).

FIG. 2 is illustrative in schematic of the longitudinal section of FIG. 1. FIG. 3 is a plan view of in what state the magneto-resistive effect device and a bias mechanism portion are positioned. FIG. 4A is a sectional view as taken on α-α of FIG. 3 (illustrative of a section of the magneto-resistive effect device), and FIG. 4B is a sectional view as taken on β-β of FIG. 3 (illustrative of a section of the bias mechanism portion).

In the following disclosure of the invention, the sizes of each device component in the X-, Y- and Z-axis directions shown in the drawings will be referred to as the "width", "length" and "thickness", respectively. The side of the device nearer to the air bearing surface (the plane of the thin-film magnetic head in opposition to the recording medium) in the Y-axis direction will be called "forward" and the opposite side (depth-wise side) will be called "rearward", and the direction of stacking the individual films up will be called "upward" or "upper side" and the opposite direction will be called "downward" or "lower side".

[Explanation of the Reproducing Head Comprising the Inventive Magneto-resistive Effect Device (MR Device)]

The construction of the reproducing head comprising the inventive magneto-resistive effect device (thin-film magnetic head) is now explained in details with reference to FIGS. 1 through 4B.

The magneto-resistive effect device (MR device) here, for instance, includes an AMR device harnessing the anisotropic magneto-resistive effect, a GMR device making use of the giant magneto-resistive effect, and a TMR device taking advantage of the tunnel type magneto-resistive effect.

Taking a GMR device (CPP-GMR device) having a CPP (current perpendicular to plane) structure with a sense current flowing in the perpendicular (stacking) direction to the plane of each of the layers forming the device as a preferable example of the magneto-resistive effect device (MR device), the embodiment of the invention here is now explained.

As shown in FIG. 1, the reproducing head according to the embodiment here comprises a first shield layer 3 (often called the lower shield layer 3) and a second shield layer 8 (often called the upper shield layer 8) that are located at a given space and opposed vertically on the sheet, and a magneto-resistive effect device 5 (often called simply the CPP-GMR device 5) interposed between the first shield layer 3 and the second shield layer 8.

As shown in FIG. 1, the reproducing head further comprises an insulating film 4 adapted to cover two sides of the CPP-GMR device 5 and a part of the upper surface of the first shield layer 3 along these sides, two bias magnetic field-applying layers 6 adjacent to the two sides of the CPP-GMR device 5 via the insulating layer 4, and a cap layer 66 formed over the bias magnetic field-applying layers 6.

In the instant embodiment shown in FIG. 1, a multilayer structure of the insulating film 4, bias magnetic field-applying layer 6 and cap layer 66 is called a bias mechanism portion 60. However, it is to be noted that the insulating layer 4 is not always necessary, although depending on the type of the MR device. For instance, the insulating film 4 is dispensed with in the MR device of the structure wherein a sense current is fed in a parallel direction with the plane of each of the layers constituting that device, viz., the MR device of the CIP (current in plane) structure.

Here let Tb be the maximum thickness of the bias mechanism portion 60 shown in FIG. 1 (the distance in nm of the bias mechanism portion between the upper and the lower shield), and Tp be the thickness of the magneto-resistive effect device 5 (CPP-GMR device 5) (the distance in nm of the MR device assembly between the upper and the lower shield). It is then preferred to satisfy the condition: $(0.7 \times Tp) \leq Tb \leq (Tp+13 \text{ nm})$. As the value of Tb−Tp is greater than 13 nm, it will most likely give rise to the so-called side reading where a media magnetic field written on the widthwise outside of the magneto-resistive effect device enters the MR stack, not the shields. When $(0.7 \times Tp) > Tb$, on the other hand, there will be inconvenience of the bias magnetic field running short.

In the embodiment here, the first 3 and the second shield layer 8 take a so-called magnetic shield role plus a pair-of-electrodes role. In other words, they have not only a function of shielding magnetism but also function as a pair of electrodes adapted to pass a sense current through the CPP-GMR device 5 in a direction intersecting the plane of each of the layers constituting the CPP-GMR device 5, for instance, in a direction perpendicular to the plane of each of the layers constituting the CPP-GMR device 5 (stacking direction).

Apart from the first 3 and the second shield layer 8, another pair of electrodes may be additionally provided above and below the CPP-GMR device 5.

In the reproducing head shown in FIGS. 1 and 2 for the purpose of illustration alone, the CPP-GMR device 5 has a multilayer film wherein an antiferromagnetic layer 22 formed on the first shield layer 8 via an underlay layer 21 and functioning as a pinning layer, a fixed magnetization layer 30 formed on the anti-ferromagnetic layer 22, a nonmagnetic layer 40 formed on the fixed magnetization layer 30, a free layer 50 formed on the nonmagnetic layer 40 and a cap layer (protective layer) 26 formed on the free layer 50 are stacked together in order.

This multilayer film is held between the first 3 and the second shield layer 8, and by applying voltage between the first 3 and the second shield layer 8, there is a sense current flowing in the thickness direction of the multilayer film.

The free layer 50 has its magnetization direction changing dependent on an external magnetic field.

The fixed magnetization layer 30 has its magnetization direction fixed by the action of the anti-ferromagnetic layer 22 having a pinning action.

In what follows, each of the layers constituting the CPP-GMR device 5 will be further explained.

(Explanation of the Fixed Magnetization Layer 30)

In the invention, the fixed magnetization layer 30 is formed on the antiferromagnetic layer 22 having a pinning action via the underlay layer 21 formed on the first shield layer 3.

The fixed magnetization layer 30 may be configured in either one single layer form or multilayer form.

Referring to the multilayer form that is a preferable form, the fixed magnetization layer 30 has a so-called synthetic pinned layer comprising three layers. That is, it comprises, in order from the side of the anti-ferromagnetic layer 22, an outer layer, a nonmagnetic intermediate layer and an inner layer, all stacked together in order. The outer and the inner layer are each provided by a ferromagnetic layer made of, for instance, a ferromagnetic material containing Co, and Fe. The outer and the inner layer are antiferromagnetically coupled and fixed such that their magnetization directions are opposite to each other.

The outer, and the inner layer is preferably formed of, for instance, a $Co_{70}Fe_{30}$ (atomic %) alloy layer. The outer layer has a thickness of preferably about 3 to 7 nm, and the inner layer has a thickness of preferably about 3 to 10 nm. The nonmagnetic intermediate layer, for instance, is made of a nonmagnetic material containing at least one selected from the group consisting of Ru, Rh, Ir, Re, Cr, Zr and Cu, and has a thickness of, for instance, about 0.35 to 1.0 nm. The nonmagnetic intermediate layer is provided to fix the magnetization of the inner layer and the magnetization of the outer layer in mutually opposite directions.

(Explanation of the Free Layer 50 and Cap Layer 26)

The free layer 50 has its magnetization direction changing depending on an external magnetic field, i.e., a signal magnetic field from the recording medium, and is formed of a ferromagnetic layer (soft magnetic layer) having a small coercive force. The free layer 50 has a thickness of, for instance, about 2 to 10 nm, and may be in either a single layer form or a multilayer form including a plurality of ferromagnetic layers.

As shown in FIG. 1, there is the cap (protective) layer 26 formed on the free layer 50. The cap layer 26, for instance, is formed of a Ta or Ru layer, and has a thickness of about 0.5 to 20 nm.

(Explanation of the Nonmagnetic Layer 40)

The nonmagnetic layer 40 is made of at least one material such as Cu, Ag, Au, Ru, Rh, Ir, Re, Cr, Zr, Al, Mg, Mn, Nb, Pd, Pt, Ta, Ti, and V, and has a thickness of about 1.0 to 2.0 nm.

When it comes to a TMR device, for instance, oxides or nitrides of Al, Ni, Gd, Mg, Ta, Mo, Ti, W, Hf and Zr may be used.

(Explanation of the Antiferromagnetic Layer 22)

The antiferromagnetic layer 22 functioning as the pinning layer works such that by way of exchange coupling with the fixed magnetization layer 30 as described above, the magnetization direction of the fixed magnetization layer 30 is fixed.

For instance, the antiferromagnetic layer 22 is made of an antiferromagnetic material containing at least one element M' selected from the group of Pt, Ru, Rh, Pd, Ni, Cu, Ir, Cr and Fe, and Mn. The content of Mn is preferably 35 to 95 at %. The antiferromagnetic material is broken down into two types: (1) a non-heat treatment type antiferromagnetic material that shows antiferromagnetism even in the absence of heat treatment to induce an exchange coupling magnetic field between it and a ferromagnetic material, and (2) a heat treatment type antiferromagnetic material that is going to show antiferromagnetism by heat treatment. In the invention, both types (1) and (2) may be used without restriction. For instance, the non-heat treatment type antiferromagnetic material is exemplified by RuRMn, FeMn, and IrMn, and the heat treatment type antiferromagnetic material is exemplified by PtMn, NiMn, and PtRhMn.

The antiferromagnetic layer 22 has a thickness of about 4 to 30 nm.

It is here noted that for the layer for fixing the magnetization direction of the fixed magnetization layer 30, it is acceptable to use a hard magnetic layer comprising a hard magnetic material such as CoPt in place of the aforesaid antiferromagnetic layer.

The underlay layer 21 formed below the anti-ferromagnetic layer 22 is provided to improve the crystallization and orientation of each of the layers stacked on it in general, and the exchange coupling of the antiferromagnetic layer 22 and the fixed magnetization layer 30 in particular. For such underlay layer 21, for instance, a multilayer of Ta and NiFe layers or Ta and NiCr layers is used. The underlay layer 21 has a thickness of about 2 to 6 nm as an example.

Further, the insulating layer 4 shown in FIG. 1 is made of, for instance, alumina. For the bias magnetic field-applying layers 6, for instance, a hard magnetic layer (hard magnet) or a multilayer structure of a ferromagnetic layer and an antiferromagnetic layer may be used, and there is the specific mention of CoPt or CoCrPt. For the cap layer 66, Cr or the like may be used, and Cr or the like may be used for the underlay layer of the bias magnetic field-applying layers 6.

(Explanation of Part of the Invention)

As shown in FIGS. 4A and 4B in particular, the essential part of the invention lies at the specification set for a relative configuration between the rear slant (see FIG. 4A in particular) of the magneto-resistive element device and the rear slant (see FIG. 4B in particular) of the bias mechanism portion.

As shown in FIGS. 2 and 4A, the magneto-resistive effect device 5 having a multilayer film comprising antiferromagnetic layer 22, fixed magnetization layer 30, nonmagnetic layer 40 and free layer 50 extends rearward from the air bearing surface 20 that is the medium opposite plane (the depth-wise side: the Y direction). And, as shown in FIG. 4A, at the rear end 5a of the magneto-resistive effect device 5, there is a rear slant PS provided that inclines from the uppermost extremity P1 of the rear end 5a of the device 5 toward the lowermost extremity P2 of the rear end 5a of the device 5 in the thickness direction.

The bias mechanism portion 60 (see FIGS. 1 and 3) including the bias magnetic field-applying layers 6 formed at both widthwise ends of the magneto-resistive effect device 5, too, extends rearward from the air bearing surface 20 that is the medium opposite plane, as shown in FIG. 4B. At the rear end 60a of the bias mechanism portion 60, there is a rear slant BS formed that inclines from the uppermost extremity B1 of the rear end 60a toward the lowermost extremity B2 of the rear end 60 in the thickness direction.

And, when the magneto-resistive effect device 5 having a multilayer film as shown in FIG. 3 and the bias mechanism portion 60 are viewed in plane on their own, the uppermost extremity P1 of the rear end 5a of the magneto-resistive effect device 5 and the uppermost extremity B1 of the rear end 60a of the bias mechanism portion 60 lie at substantially the same depth-wise position (the position of distance Y1 form the air bearing surface 20). It follows that the uppermost extremity P1 of the rear end 5a of the magneto-resistive effect device 5 and the uppermost extremity B1 of the rear end 60a of the bias mechanism portion 60 lie on a line L1 indicated in FIG. 3. The "substantially the same depth-wise position" is understood to mean that the depth-wise positions Y1 of the uppermost extremities B1 and P1 lie in the range of ±3% with respect to the predetermined depth-wise length.

In addition to the inventive requirement that the depth-wise positions Y1 of the aforesaid uppermost extremities P1 and B1 are substantially the same, there is another requirement that the rear slant BS of the bias mechanism portion 60 is gentler in gradient than the rear slant PS of the magneto-resistive effect device 5; this requirement is a unheard-of feature unique to the invention. And, in a more preferable embodiment of the invention, the rear slant (BS) of the bias mechanism portion 60 is formed such that the thickness (H1) of each bias magnetic field-applying layer 6 of the bias mechanism portion 60—found at a depth-wise position of FIG. 4B (Y2: the distance to line L2) lying at the same position as a depth-wise position (Y2: the distance to line L2) of the rear slant PS of the magneto-resistive effect device 5 shown in FIG. 4A at which the lowermost extremity F2 of the free layer 50 is positioned—accounts for at least 70% of the total thickness (H0) of the bias magnetic field-applying layer. In other words, the rear slant (BS) of the bias mechanism portion 60 is formed in such a way as to satisfy $H1/H0 \geq 0.7$.

The higher the aforesaid ratio % of (H1) to (H0) (for instance, as that ratio rises to 80% or 90%), the gentler the inclination of the slant of the rear slant BS of the bias mechanism portion 60, and the more the lowermost extremity B2 of the rear end of the bias mechanism portion 60 shown in FIG. 4B extends in the depth-wise direction (the Y direction: the right direction on the sheet).

The formation of the feature comprising such a desired rear slant requires an unheard-of, novel milling technique. More specifically, when the rear slant (BS) of the bias mechanism portion 60 and the rear slant (PS) of the magneto-resistive effect device 5 are co-formed by ion milling, the desired feature of the invention of this application is achievable by use of a method wherein ion milling is carried out early with Ar gas, and then with a mixed gas of Ar gas plus oxygen.

For an easier understanding of such a feature of the invention, it is required to have an understanding beforehand of how to fabricate the vicinity of the device structure of the reproducing head. First of all, therefore, how to fabricate the vicinity of the device structure of the reproducing head is schematically explained with reference to FIGS. 5A to 5D and FIGS. 6A to 6D.

FIGS. 5A to 5D are sectional views over time of how to fabricate the device structure portion of the reproducing head in particular, and FIGS. 6A to 6D are plan views of how to fabricate the device structure portion of the reproducing head. Note here that the drawings having the same alphabet (for instance, FIGS. 5A and 6A) are a sectional view and a plan view in the same process step, respectively.

Figure 6A:
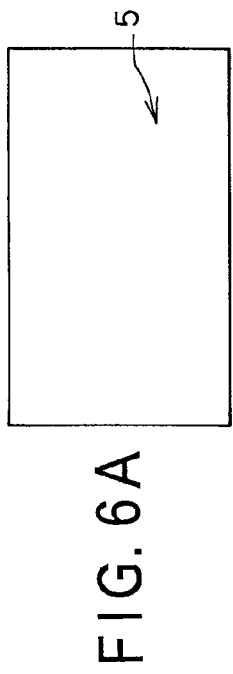
FIGS. 6A, 6B, 6C and 6D are illustrative in plane of the process of fabricating the device structure portion of the reproducing head.
Figure 5A:
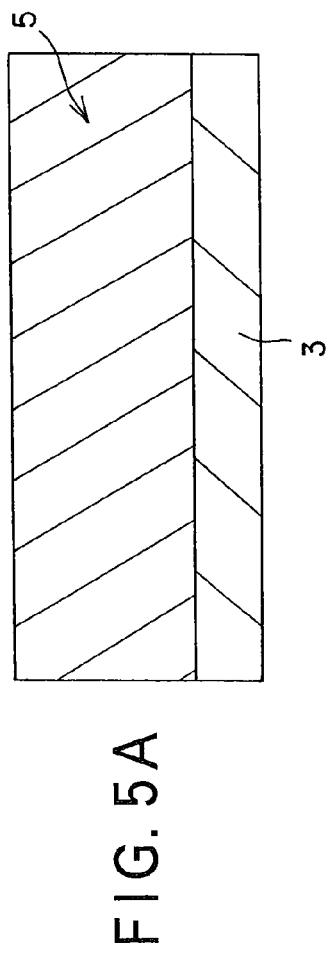
FIGS. 5A, 5B, 5C and 5D are illustrative in section and over time of the process of fabricating the device structure portion in particular of the reproducing head.

(1) Explanation of the steps shown in FIGS. 5A and 6A

Planar films of underlay layer 21, anti-ferromagnetic layer 22, fixed magnetization layer 30, nonmagnetic layer 40, free layer 50 and cap (protective) layer 26 are stacked in order on the lower shield layer (that also serves as the lower electrode) into a multilayer planar film that provides a base for the magneto-resistive effect device 5. Note here that in FIGS. 5A and 6A, the multilayer planar film or the base for the magneto-resistive effect device 5 is shown as a plane blank; it is merely indicated by reference numeral 5 (often called simply the MR film 5).

Figure 6B:
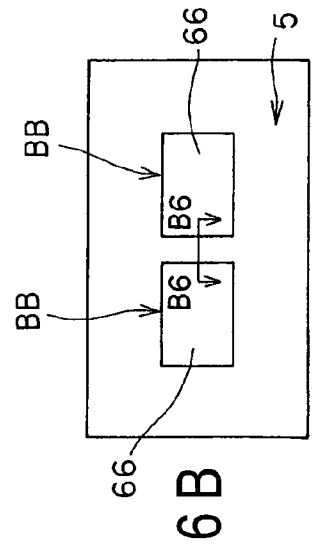
Figure 5B:
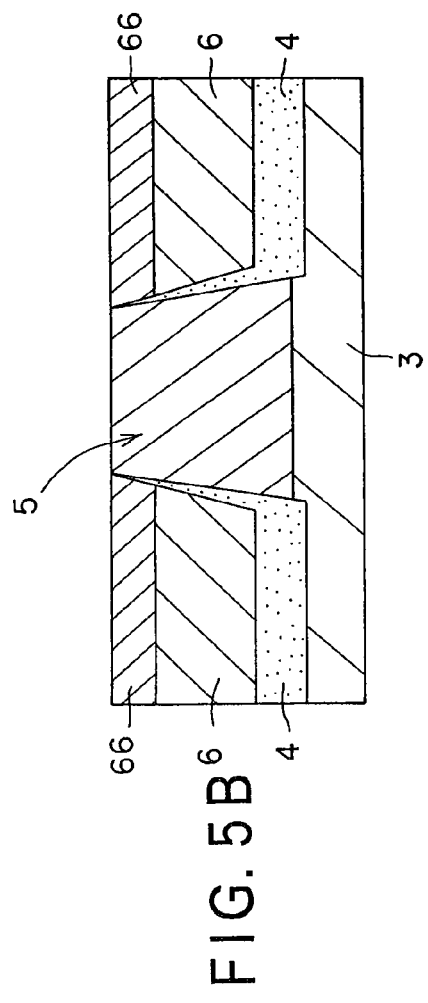

(2) Explanation of the Steps Shown in FIGS. 5B and 6B

FIG. 5B is a sectional view taken on double arrows B6-B6 of FIG. 6B.

To form tracks on the MR film 5 shown in FIG. 6B, the MR film 5 is milled. More specifically, to expose only the areas marked off by two rectangles BB, the rest of the film is masked over by a photoresist. The areas delimited by the rectangles BB are milled off to dig in the MR film 5 down to the lower shield layer 3 to leave open an opening. Thereafter, the insulating layer 4, bias magnetic field-applying layers 6 and protective layer 66 for the bias magnetic field-applying layers are filled in order in the opening left open by milling, and the photoresist mask is lifted off to create the states shown in FIGS. 5B and 6B.

Figure 6C:
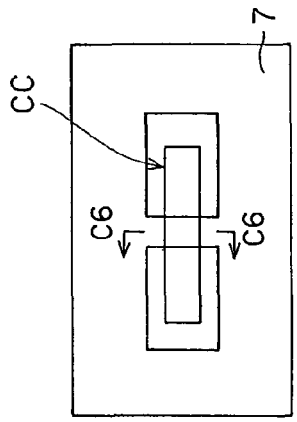
Figure 5C:
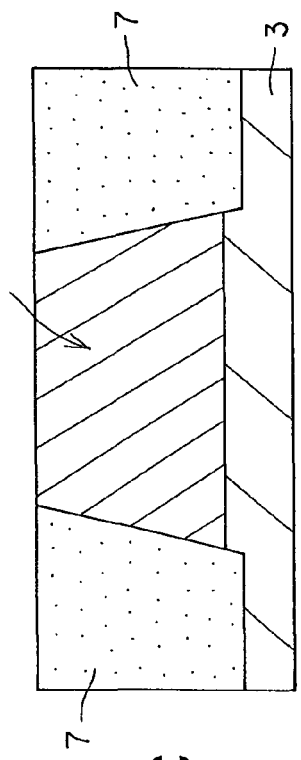

(3) Explanation of the Steps Shown in FIGS. 5C and 6C

FIG. 5C is a sectional view taken on double arrows C6-C6 of FIG. 6C.

To form the so-called MR height that is the depth-wise length of the MR film 5 shown in FIG. 6C, the area marked off by a rectangle CC in FIG. 6C is masked over by a photoresist, and the unmasked rest is milled off to dig in the MR film 5 down to the lower shield layer 3. Note here that for milling, the milling method unique to the invention is selected to achieve the feature of the invention. Thus, the rear slant PS of the magneto-resistive effect device (FIG. 4A in particular) and the rear slant BS of the bias mechanism portion (FIG. 4B in particular) are configured as desired.

Thereafter, the insulating layer 7 is formed in the resultant opening, and the mask is lifted off to create the states shown in FIGS. 5C and 6C. The device assembly sits on the lower shield layer 3, and the rest is provided on the substrate with the insulating layer. It follows that the insulating layer 7 takes a role of electrically isolating the device from the rest.

Figure 6D:
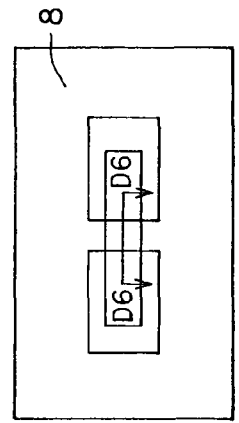
Figure 5D:
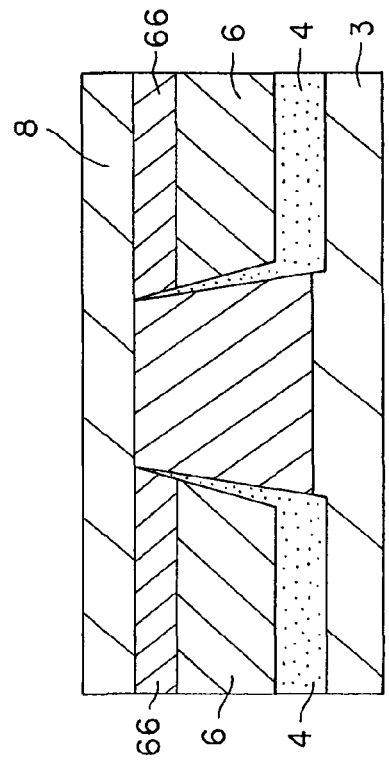

(4) Explanation of The Steps Shown in FIGS. 5D and 6D

FIG. 5D is a sectional view taking on double D6-D6 of FIG. 6D.

There is the upper shield layer 8 (that also serves as an upper electrode) formed to create the states shown in FIGS. 5D and 6D.

[Explanation of How to Create the Feature of The Invention]

How to create the desired configurations (feature) of the rear slant PS of the magneto-resistive effect device (see FIG. 4A in particular) and the rear slant BS of the bias mechanism portion (see FIG. 4B in particular) is now explained with reference to FIGS. 7A, 7B and 7C.

Figure 7A:
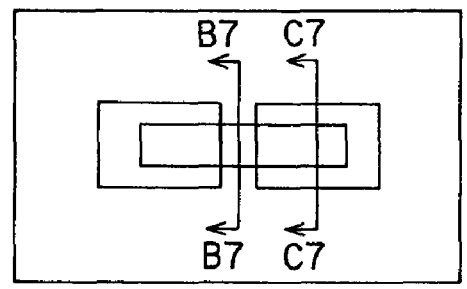
FIG. 7A is illustrative in plane of how to make the feature of the invention.
Figure 7B:
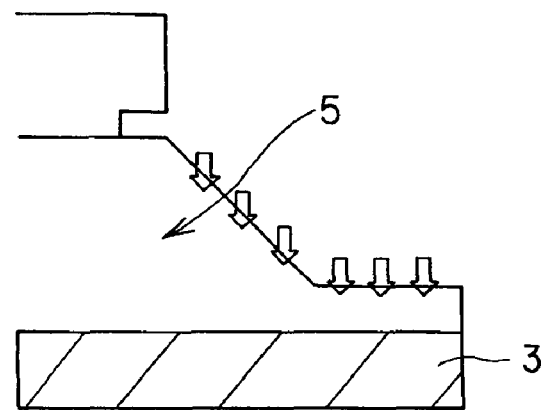
FIG. 7B is a sectional view taken on B7-B7 of FIG. 7A, illustrative in schematic of in what state the rear slant PS in particular of the magneto-resistive effect device is created.

FIG. 7A is a plan view illustrative of how to achieve the feature of the invention. FIG. 7B is a sectional view taken on B7-B7 of FIG. 7A; it is illustrative in schematic of how the rear slant PS of the magneto-resistive effect device can be created. FIG. 7C is a sectional view taking on C7-C7 of FIG. 7A; it is illustrative in schematic of how the rear slant BS of the bias mechanism portion in particular can be created.

(Principles)

In ion milling using Ar gas to form the so-called MR height of the MR film 5, the selection ratio of the respective layers to be ion milled is small at the site of the MR film 5 that, inclusive of the lower shield layer, is all formed of a multilayer structure of metal films, so that it is easy to keep a constant taper at the time of height formation.

In association with the formation of the aforesaid MR height, the bias mechanism portion, too, is subjected to similar hight milling. In the ion milling method using Ar gas, however, the insulating layer 4 formed of, e.g., alumina is harder than the bias magnetic field-applying layers. In other words, the ion milling rate of the insulating layer 4 using Ar gas becomes low. Accordingly, as the height milling of the bias mechanism portion reaches as far as the insulating layer 4, milling does no longer occur in the film plane direction; that is, it occurs preferentially at the slant alone. As a result, the height taper of the bias mechanism portion is likely to be more precipitous than that of the MR film 5. It follows that only with the conventional ion milling mode using Ar gas, the rear slant PS of the magneto-resistive effect device, and the rear slant BS of the bias mechanism portion, each being the desired feature of the invention, cannot be formed. In other words, what is obtained in the prior art mode is just opposite in configuration to the rear slant intended herein; that is, with the prior art mode, the rear slant (BS) of the bias mechanism portion is much more precipitous than the rear slant (PS) of the magneto-resistive effect device.

Figure 7C:
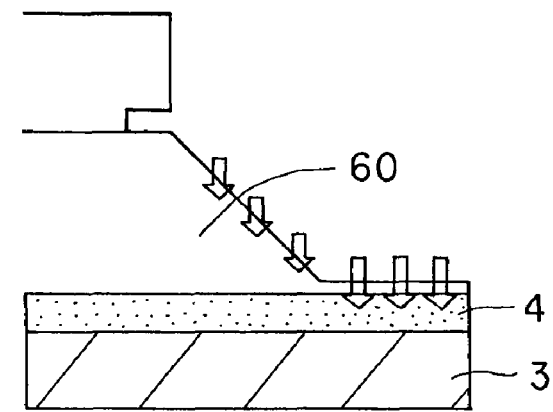
FIG. 7C is a sectional view taken on C7-C7 of FIG. 7A, illustrative in schematic of in what state the rear slant BS in particular of the bias mechanism portion is created.

In the invention of this application, therefore, ion milling using Ar gas is carried out until the height milling of the bias mechanism portion 60 reaches as far as the insulating layer 4, as shown in FIG. 7C. The subsequent milling is carried using Ar gas plus oxygen. In other words, the first ion milling is changed over to the ion milling using $Ar/O_2$ mixed gas.

With the ion milling using $Ar/O_2$ mixed gas, the height taper of the bias mechanism portion becomes gentler than that of the magneto-resistive effect device, because the metal films grow harder than does the insulating layer 4 made of alumina. It follows that there is the feature of the invention of this application obtained, which makes sure the rear slant (BS) of the bias mechanism portion 60 is gentler than the rear slant (PS) of the magneto-resistive effect device.

(Explanation of The Whole Construction of the Thin-film Magnetic Head)

The whole construction of the thin-film magnetic head comprising the aforesaid magneto-resistive effect device is now explained.

Figure 8:
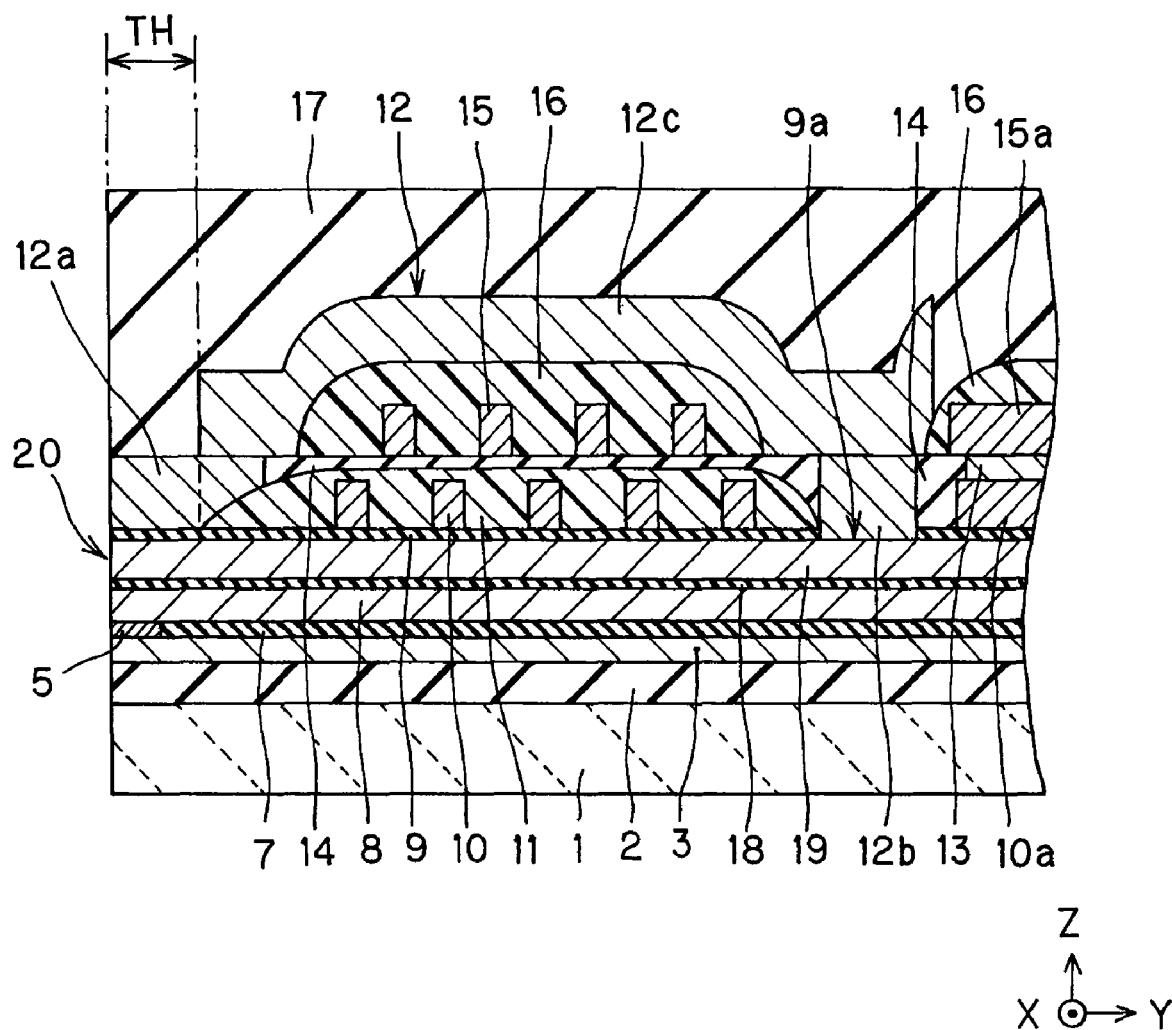
FIG. 8 is illustrative of the construction of the thin-film magnetic head according to one preferable embodiment of the invention; it is a sectional view illustrative of a section of the thin-film magnetic head perpendicular to the medium opposite plane and the substrate.
Figure 9:
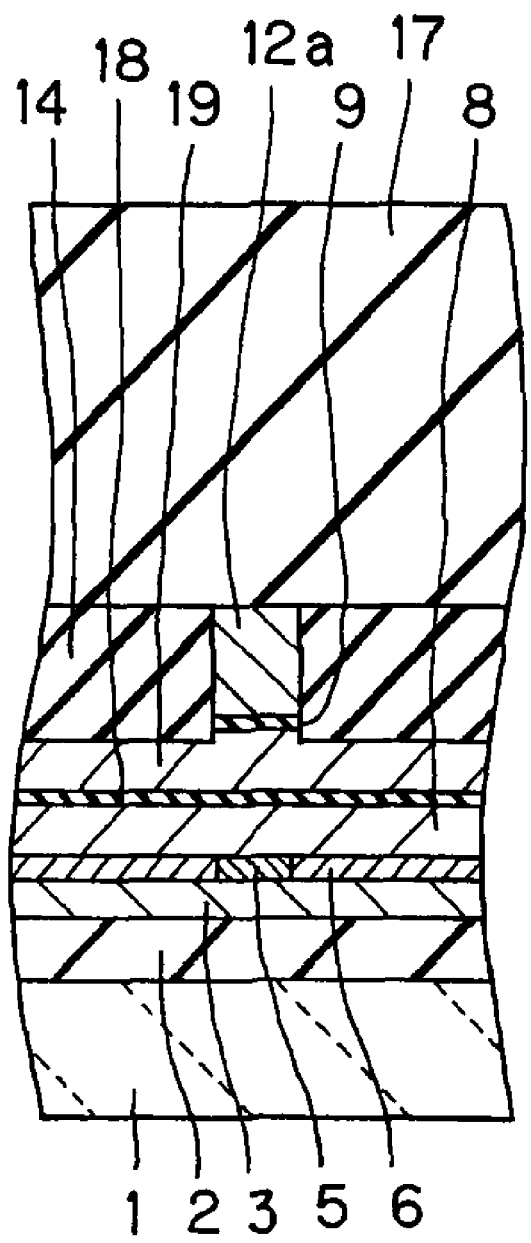
FIG. 9 is illustrative of the construction of the thin-film magnetic head according to one preferable embodiment of the invention; it is illustrative of a section of the magnetic pole portion of the thin-film magnetic head parallel with the medium opposite plane.
Figure 9:
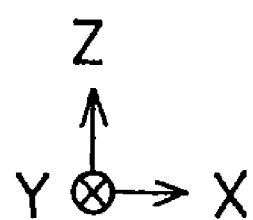

FIGS. 8 and 9 are illustrative of the whole construction of the thin-film magnetic head according to one preferred embodiment of the invention; FIG. 8 is illustrative of a section of the thin-film magnetic head perpendicular to the ABS and a substrate, and FIG. 9 is illustrative of a section of a magnetic pole portion of the thin-film magnetic head parallel with the ABS.

The whole structure of the thin-film magnetic head would be better understood when consideration is given to its fabrication process steps; the whole structure of the thin-film magnetic head is now explained with reference to its fabrication process steps.

First of all, an insulating layer 2 comprising an insulating material such as alumina ($Al_2O_3$) or silicon dioxide ($SiO_2$) is formed by sputtering or like techniques on a substrate 1 comprising a ceramic material such as AlTiC ($Al_2O_3.TiC$). That insulating layer has a thickness of typically about 0.5 to 20 μm.

Then, a lower shield layer 3 comprising a magnetic material and adapted for a reproducing head is formed on that insulating layer 2. The shield layer 3 has a thickness of typically about 0.1 to 5 μm. The magnetic material used for such lower shield layer 3, for instance, includes FeAlSi, NiFe, CoFe, CoFeNi, FeN, FeZrN, FeTaN, CoZrNb, and CoZrTa. The lower shield layer 3 is formed by sputtering, plating or like other techniques.

Then, a CPP-GMR device having a reproducing CPP-GMR device 5 is formed on the lower shield layer 3.

Although not shown, an insulating film (that is on a par with the insulating film 4 of FIG. 1) is then formed in such a way as to cover two sides of the CPP-GMR device 5 and the upper surface of the first shield layer 3. The insulating film is formed of an insulating material such as alumina.

Then, a bias mechanism portion 60 including bias magnetic field-applying layers 6 are formed in such a way as to be adjacent to the two sides of the CPP-GMR device 5 via the insulating layer.

Then, a refilled insulation layer 7 is formed in such a way as to be located around the CPP-GMR device 5 and bias mechanism portion 60 (bias magnetic field-applying layers 6).

Then, a second shield layer 8 for the reproducing head, comprising a magnetic material, is formed on the CPP-GMR device 5, bias mechanism portion 60 (bias magnetic field-applying layers 6) and refilled insulation layer 7. The second shield layer 8, for instance, is formed by means of plating or sputtering.

Then, a separation layer 18 comprising an insulating material such as alumina is formed by sputtering or the like on the upper shield layer 8. Then, a lower magnetic pole layer 19, comprising a magnetic material and adapted for a recording head, is formed by plating, sputtering or the like on the separation layer 18. The magnetic material used for the second shield layer 8, and the lower magnetic pole layer 19, for instance, includes a soft magnetic material such as NiFe, CoFe, CoFeNi, and FeN. It is here noted that instead of the multilayer arrangement of the second shield layer 8, separation layer 18 and lower magnetic pole layer 19, it is acceptable to configure the second shield layer in such a way as to work also as a lower electrode layer.

Then, a recording gap layer 9 comprising a non-magnetic material such as alumina is formed by sputtering or the like on the lower magnetic pole layer 19. That recording gap layer has a thickness of about 50 to 300 nm.

For the formation of a magnetic path, the recording gap layer 9 is then partially etched at the center of the thin-film coil to be described later to form a contact hole 9a.

Then, a first layer portion 10 of the thin-film coil, typically comprising copper (Cu), is formed on the recording gap layer 9 at a thickness of typically 2 to 3

In FIG. 8, note that reference numeral 10a stands for a connector portion of the first layer portion 10, which is to be connected to a second layer portion 15 of the thin-film coil to be described later. The first layer portion 10 is wound around the contact hole 9a.

Then, an insulating layer 11 comprising a photo-resist or other organic material having fluidity upon heating is formed in such a given pattern as to cover the first layer portion 10 of the thin-film coil and the surrounding recording gap layer 9.

Then, the insulating layer 11 is heat treated at a given temperature to make its surface flat. By this heat treatment, each of the edge portions of the outer and inner peripheries of the insulating layer 11 is configured into a rounded slant.

Then, in an area of the insulating layer 11 from a slant portion on the medium opposite plane 20 (to be described later) side to the medium opposite plane 20 side, a track width-setting layer 12a of an upper magnetic pole layer 12 is formed on the recording gap layer 9 and insulating layer 11, using the magnetic material for the recording head. The upper magnetic pole layer 12 is made up of that track width-setting layer 12a, and a coupler portion layer 12b and a yoke portion layer 12c to be described later.

The track width-setting layer 12a is formed on the recording gap layer 9, including an end portion that provides a magnetic pole portion of the upper magnetic pole layer 12 and a connector portion that is formed on the slant portion of the insulating layer 11 on the medium opposite plane 20 side and connected to the yoke portion layer 12c. The width of that end portion is set equal to the recording track width, and the width of the connector portion is greater than the width of the end portion.

Simultaneously with the formation of the track width-setting layer 12a, the coupler portion 12b comprising a magnetic material is formed on the contact hole 9a and a connector layer 13 comprising a magnetic material is formed on the connector portion 10a. The coupler portion layer 12b forms a portion of the upper magnetic pole layer 12, which is to be magnetically connected to the upper shield layer 8.

Then, magnetic pole trimming is carried out. That is, in an area around the track width-setting layer 12a, the track width-setting layer 12a is used as a mask to etch at least a part of the recording gap layer 9 and the magnetic pole portion of the upper shield layer 8 on the recording gap layer 9 side, whereby, as shown in FIG. 9, there is a trim structure formed, in which at least a part of the magnetic pole portion of the upper magnetic pole layer 12, the recording gap layer 9 and the magnetic pole portion of the upper shield layer 8 has a uniform width. This trim structure makes sure prevention of an effective increase in the track width due to the spread of a magnetic flux near the recording gap layer 9.

Then, an insulating layer 14 comprising alumina or other inorganic insulating material is formed around the whole at a thickness of typically 3 to 4 μm.

Then, that insulating layer 14 is polished by chemomechanical polishing or the like as far as the surfaces of the track width-setting layer 12a, coupler portion layer 12b and connector layer 13 for flattening.

Then, the second layer portion 15 of the thin-film coil typically comprising copper (Cu) is formed on the flattened insulating layer 14 at a thickness of typically 2 to 3 μm. In FIG. 8, note that reference numeral 15a is indicative of a connector portion of the second layer portion 15, which is to be connected to the connector portion 10a of the first layer portion 10 of the thin-film coil by way of the connector layer 13. The second layer portion 15 is wound around the coupler portion layer 12b.

Then, an insulating layer 16 comprising a photoresist or other organic material having fluidity upon heating is formed in such a given pattern as to cover the second layer portion 15 of the thin-film coil and the surrounding insulating layer 14.

Then, the insulating layer 16 is heat treated at a given temperature to make its surface flat. By this heat treatment, each of the edge portions of the outer and inner peripheries of the insulating layer 16 is configured into a rounded slant.

Then, the magnetic material for the recording head such as permalloy is used to form the yoke portion layer 12c forming the yoke portion of the upper magnetic layer 12 on the track width-setting layer 12a, insulating layers 14, 16 and coupler portion layer 12b. An end of the yoke layer portion 12c on the medium opposite plane 20 side is spaced away from the medium opposite plane 20, and the yoke portion layer 12c is connected to the lower magnetic pole layer 19 by way of the coupler portion layer 12b.

Then, an overcoat layer 17 typically comprising alumina is formed in such a way as to cover the whole. Finally, a slider including the aforesaid respective layers is machined to form the medium opposite plane 20 of the thin-film head including the recording head and reproducing head in the form of a complete thin-film magnetic head.

The thus fabricated thin-film magnetic head comprises the medium opposite plane 20 in opposition to the recording medium, the aforesaid reproducing head and the recording head.

The magnetic head comprises the magnetic lower and upper magnetic pole layers 19 and 12 that include mutually opposite magnetic pole portions on the medium opposite plane 20 side and are magnetically coupled to each other, the recording gap layer 9 located between the magnetic pole portion of the lower magnetic pole layer 19 and the magnetic pole portion of the upper magnetic pole layer 12, and the thin films 10, 15 at least a part of which is located between the lower 19 and the upper magnetic pole layer 12 while insulated from them.

As shown in FIG. 8, such a thin-film magnetic head has a throat height (indicated by TH in the drawing) that is defined by a length from the medium opposite plane 20 up to the end of the insulating layer 11 on the medium opposite plane side. In other words, the "throat height" means a length (height) from the medium opposite plane 20 to a position at which the two magnetic pole layers start being spaced away.

It is here understood that there is no limitation imposed on the type of the recording head; even a head for perpendicular magnetic recording mode may just as well be used. For instance, a perpendicular magnetic recording head structure set forth in JP(A)2006-155866 may just as sell be used.

(Explanation of How The Thin-film Magnetic Head Works)

How the thin-film magnetic head according to the embodiment here works is now explained. The thin-film magnetic head records information in the recording medium by the recording head, and plays back the information recorded in the recording medium by the reproducing head.

At the reproducing head, the direction of a bias magnetic field applied by the bias magnetic field-applying layers 6 is orthogonal to a direction perpendicular to the medium opposite plane 20. At the CPP-GMR device 5 with no signal magnetic field applied yet, the magnetization direction of the free layer 50 lies in alignment with the direction of the bias magnetic field, and the magnetization direction of the fixed magnetization layer 30 is fixed in a direction perpendicular to the medium opposite plane 20.

At the CPP-GMR device 5, there is a change in the magnetization direction of the free layer 50 depending on a signal magnetic field from the recording medium, which in turn causes a change in the relative angle between the magnetization direction of the free layer 50 and the magnetization direction of the fixed magnetization layer 30, with the result that there is a change in the resistance value of the CPP-GMR device 5. The resistance value of the CPP-GMR device 5 may be found from a potential difference between the first and second shield layers, i.e., the two electrode layers 3 and 8 at the time when a sense current is passed through the MR device. It is thus possible for the reproducing head to play back the information recorded in the recording medium (Explanation of the Head Gimbal Assembly and The Magnetic Disk System)

The head gimbal assembly and the magnetic disk system according to the embodiment here are now explained.

A slider 210 included in the head gimbal assembly is first explained with reference to FIG. 10. In the magnetic disk system, the slider 210 is located in such a way as to face a hard disk that is a rotationally driven disk-form recording medium. This slider 210 primarily comprises a substrate 211 built up of a substrate 1 and an overcoat 17 depicted in FIG. 8.

The substrate 211 is in a generally hexahedral shape. Of the six surfaces of the substrate 211, one surface is in opposition to the hard disk. On that one surface there is a medium opposite plane 20 formed.

Figure 10:
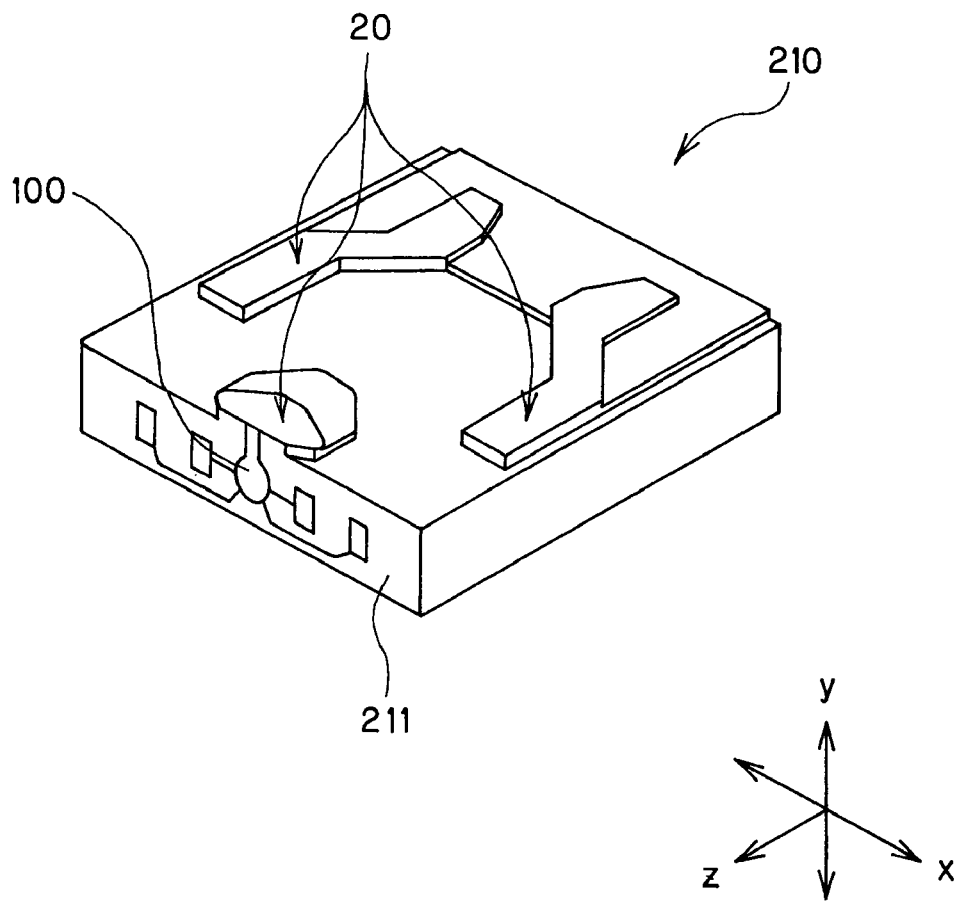
FIG. 10 is a perspective view of a slider built in the head gimbal assembly according to one embodiment of the invention.

As the hard disk rotates in the z-direction in FIG. 10, it causes an air flow passing between the hard disk and the slider 210 to induce lift in the downward y-direction in FIG. 10. This lift in turn causes the slider 210 to levitate over the surface of the hard disk. Note here that the x-direction in FIG. 10 traverses tracks on the hard disk.

Near the end of the slider 210 on an air exit side (the left lower end in FIG. 10), there is the thin-film magnetic head 100 formed according to the embodiment here.

A head gimbal assembly 220 according to this embodiment is now explained with reference to FIG. 11. The head gimbal assembly 220 comprises a slider 210 and a suspension 221 adapted to resiliently support that slider 210. The suspension 221 comprises a leaf spring-form load beam 222 formed typically of stainless steel, a flexure 223 attached to one end of the load beam 222 and having the slider 210 joined to it for giving a suitable degree of flexibility to the slider 210, and a base plate 224 attached to the other end of the load beam 222.

The base plate 224 is adapted to be attached to an arm 230 of an actuator for moving the slider 210 in the track traverse direction x of the hard disk 262. The actuator comprises the arm 230 and a voice coil motor for driving that arm 230. At a portion of the flexure 223 having the slider 210 attached to it, there is a gimbal portion provided for keeping the posture of the slider 210 constant.

The head gimbal assembly 220 is attached to the arm 230 of the actuator. The head gimbal assembly 220 attached to one arm 230 is called a head arm assembly, whereas the head gimbal assembly 220 attached to a carriage at its plurality of arms is referred to as a head stack assembly.

Figure 11:
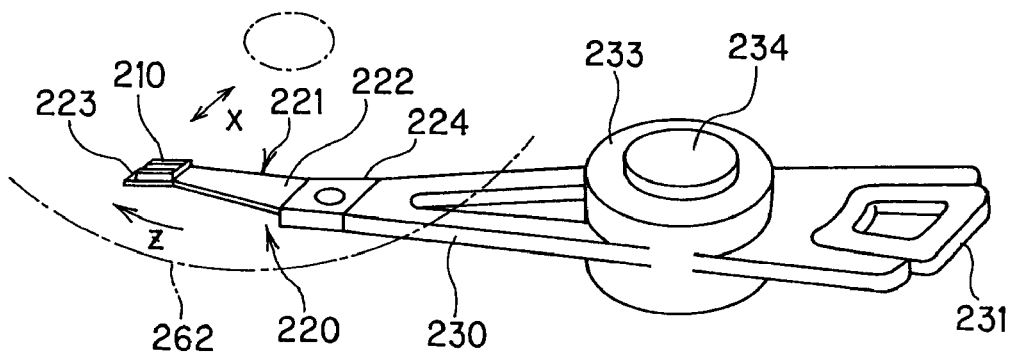
FIG. 11 is a perspective view of a head arm assembly including the head gimbal assembly according to one embodiment of the invention.

FIG. 11 illustrates one example of the head arm assembly, wherein the head gimbal assembly 220 is attached to one end of the arm 230. To the other end of the arm 230, a coil 231 forming a part of the voice coil motor is attached. Halfway across the arm 230, there is a bearing portion 233 attached to a shaft 234 adapted to support the arm 230 in a pivotal fashion.

One example of the head stack assembly and the magnetic disk system according to the instant embodiment are now explained with reference to FIGS. 12 and 13.

Figure 12:
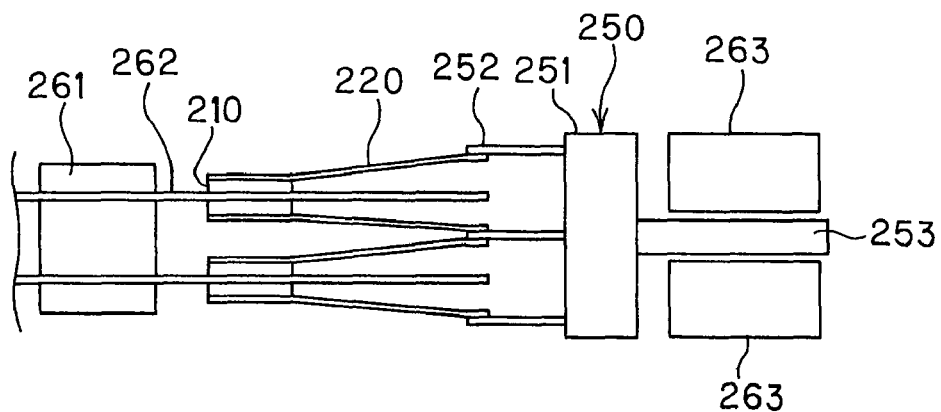
FIG. 12 is illustrative of part of the magnetic disk system according to one embodiment of the invention.
Figure 13:
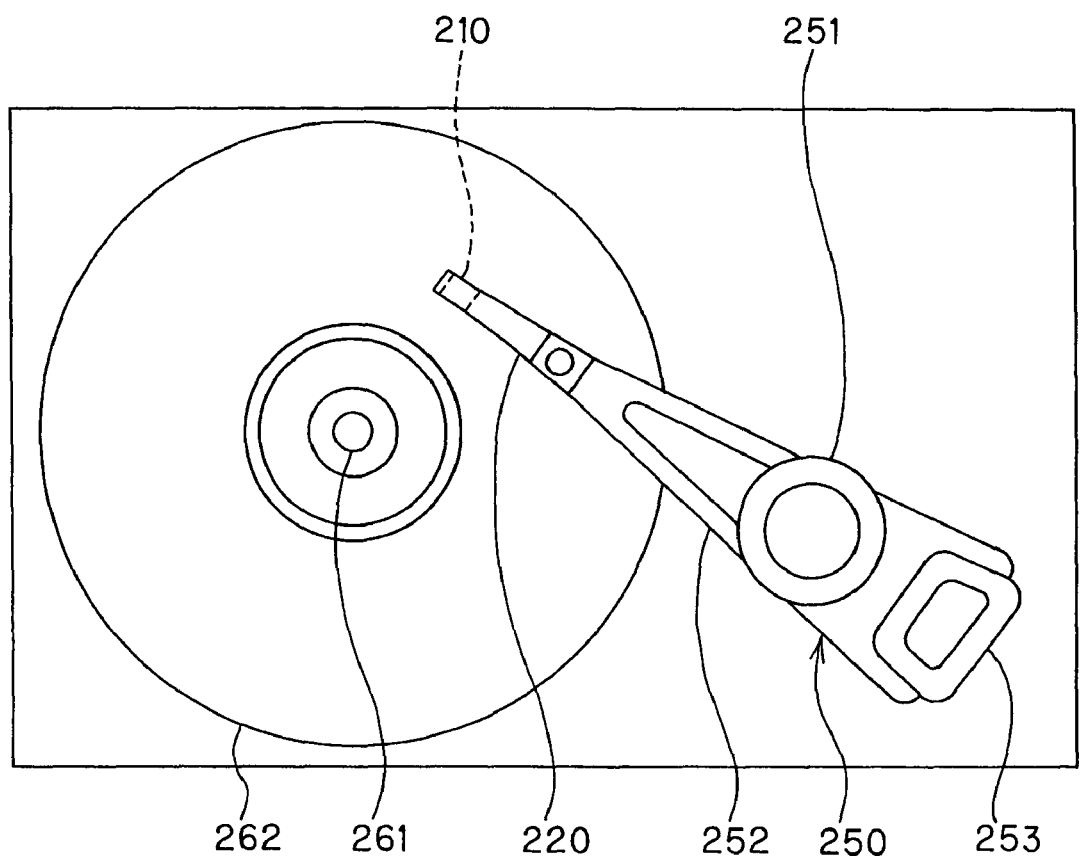
FIG. 13 is a plan view of the magnetic disk system according to one embodiment of the invention.
Figure 14:
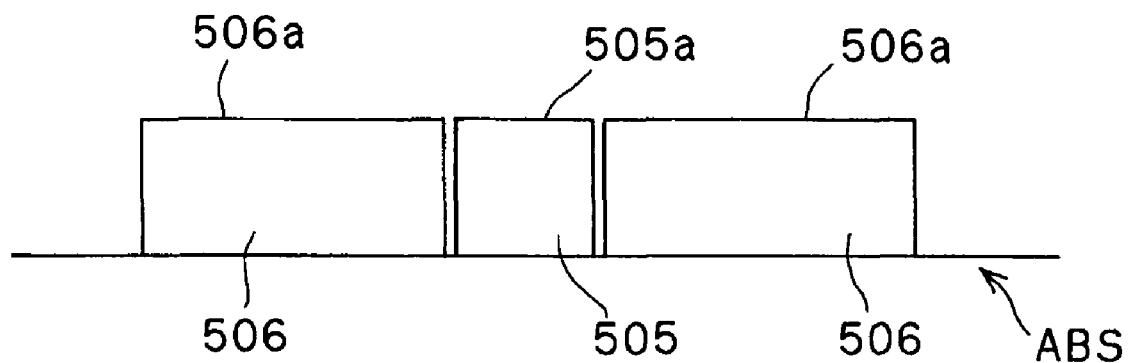
FIG. 14 is a plan view of one prior art example, illustrative of in what states a magneto-resistive effect device and a bias mechanism portion are positioned.
Figure 15:
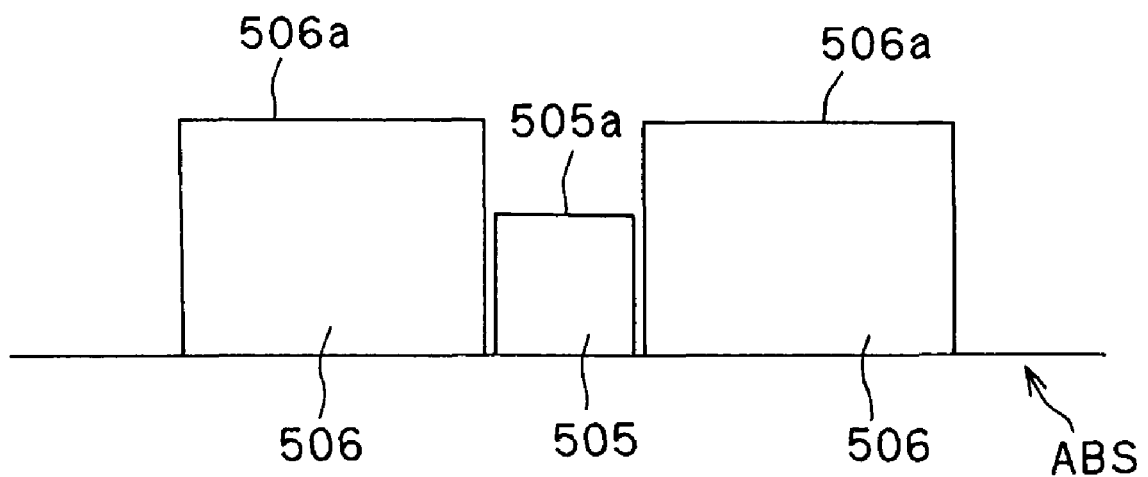
FIG. 15 is a plan view of another prior art example, illustrative of in what states a magneto-resistive effect device and a bias mechanism portion are positioned.

FIG. 12 is illustrative of part of the magnetic disk system, and FIG. 13 is a plan view of the magnetic disk system.

A head stack assembly 250 comprises a carriage 251 having a plurality of arms 252. The plurality of arms 252 are provided with a plurality of the head gimbal assemblies 220 such that they line up vertically at an interval. On the side of the carriage 251 that faces away from the arms 252, there is a coil 253 attached, which coil becomes a part of the voice coil motor. The head stack assembly 250 is incorporated in the magnetic disk system.

The magnetic disk system comprises a plurality of hard disks 262 attached to a spindle motor 261. For each hard disk 262, two sliders 210 are located such that they are opposite to each other with the hard disk 262 held between them. The voice coil motor has also permanent magnets 263 located at opposite positions with the coil 253 of the head stack assembly 250 held between them.

The head stack assembly 250 except the slider 210 and the actuator correspond to the positioning device here which is operable to support the slider 210 and position it relative to the hard disk 262.

With the magnetic disk system here, the actuator is actuated to move the slider 210 in the track traverse direction of the hard disk 262, thereby positioning the slider 210 with respect to the hard disk 262. The thin-film magnetic head incorporated in the slider 210 works such that information is recorded by a recording head in the hard disk 262, and the information recorded in the hard disk 262 is played back by a reproducing head.

The head gimbal assembly and the magnetic disk system here have pretty much the same action as the thin-film magnetic head according to the foregoing embodiment.

While the embodiment here has been described with reference to the thin-film magnetic head of the structure wherein the reproducing head is located on the substrate side and the recording head is stacked on the reproducing head, it is contemplated that that order of stacking could be reversed When the thin-film magnetic head here is used as a read-only head, the recording head could be removed from it.

It is also contemplated that part of the invention may be applied not only to magnetic heads but also as a so-called thin-film magnetic field sensor adapted to detect a magnetic field.

EXPLANATION OF THE SPECIFIC EXPERIMENTAL EXAMPLES

The thin-film magnetic head according to the invention as described above is now explained in more details with reference to the following specific experimental examples.

Experimental Example I

A thin-film magnetic head sample comprising a magneto-resistive effect device comprising such a multilayer structure as set out in Table 1 given below and such a bias mechanism portion as set out in Table 2 given below was prepared by such preparation steps as illustrated in FIGS. 5A-5D and FIG. 6A-6D.

TABLE 1

(Setup of the Magneto-Resistive Effect Device)

| Multilayer Structure | | Layer Material | Thickness (nm) |
|---|---|---|---|
| Cap (Protective) Layer | | Ta | 5.0 |
| Free Layer | | NiFe | 5.0 |
| | | CoFe | 1.0 |
| Nonmagnetic Layer | | Cu | 1.5 |
| Fixed Magnetization Layer | Inner Layer | CoFe | 2.4 |
| | Nonmagnetic Intermediate Layer | Ru | 0.8 |
| | Outer Layer | CoFe | 2.0 |
| Antiferromagnetic Layer | | IrMn | 6.0 |
| Underlay Layer | | NiFe | 2.0 |
| | | Ta | 2.0 |

TABLE 2

(Setup of the Bias Mechanism Portion)

| Multilayer Structure | Layer Material | Thickness (nm) |
|---|---|---|
| Cap (Protective) Layer | Cr | 5.0 |
| Bias Magnetic Field Applying Layer | CoPt | 25.0 |
| Underlay Layer | Cr | 5.0 |
| Insulating Layer | $Al_2O_3$ | 7.5 |

First of all, such preparatory experimentation as given below was conducted.

That is to say, the time taken by the ion milling using Ar gas until the magneto-resistive effect film set out in Table 1 was dug through at the so-called MR height formation step was about 280 seconds as measured. When the bias mechanism portion set out in Table 2 was milled under the same conditions, on the other hand, that time was about 230 seconds in which milling reached down to the insulating layer of alumina with the cap layer, bias magnetic field-applying layer and underlay layer being all taken off.

On the basis of such results of the preparatory experimentation, ion milling using Ar gas was performed for a first 230 seconds. Thereafter, the mixed gas of Ar gas plus oxygen gas was used for ion milling until the magneto-resistive effect device was milled down to a given depth. The amount of the oxygen added was varied between 0%, 4.8%, 8.0%, 13.0% and 15.8% as shown in Table 3 to prepare samples having several rear slants.

It is here noted that when oxygen is added to Ar, the milling rate of the insulating layer is almost invariable, but the milling rate of the metal layers in general, and the metal layer having a strong oxidization tendency in particular, becomes very slow. As a result, there is a reversal in the milling rate of the insulating layer made of alumina and the metal layers.

And each of the prepared samples was actually measured at multiple points for the value of (H1/H0) or the rate % of (H1) to (H0) shown in FIG. 4B while checking TEM sections, and for the rate of occurrence of noise of each sample as well.

(1) Actual Measurement of The Value of (H1/H0)

While polishing was done in the X direction on the Y-Z plane, the states of FIGS. 4B and 4A were measured by observing TEM sections. It is here noted that the polishing distance in the X direction at which the state of FIG. 4B transitioned to the state of FIG. 4A was very much short; observation of sections of FIGS. 4B and 4A was carried out using one sample plus another dummy sample adjacent to it in the X direction.

(2) Measurement of The Rate of Occurrence of Noise

Noise pulses count is measured while the magnetic field is swept at ±400 Oe. Noise pulses having a height of 30% or more of the output are counted. A device having more than 500 pulses is rejected as a defective. This inspection was made with 500 devices, and the percent defective was given in terms of the rate of occurrence of noise.

The results are set out in Table 3 given below.

TABLE 3

| Sample No. | Amount of Oxygen Added (%) | (H1/H0) × 100 (%) | Rate of Occurrence of Noise (%) |
|---|---|---|---|
| 1 | 0 | 12 | 19.3 |
| 2 | 4.8 | 58 | 15.4 |

TABLE 3-continued

| Sample No. | Amount of Oxygen Added (%) | (H1/H0) × 100 (%) | Rate of Occurrence of Noise (%) |
|---|---|---|---|
| 3 | 8.0 | 72 | 4.3 |
| 4 | 13.0 | 89 | 3.3 |
| 5 | 15.8 | 93 | 3.0 |

From the results set out in Table 3, it is found that when (H1/H0) is more than 70%, the rate of occurrence of noise is much more reduced.

From the foregoing results, the advantages of the invention would be undisputed. That is to say, the thin-film magnetic head of the invention comprises a magneto-resistive effect device including a multilayer film and a bias mechanism portion including a bias magnetic field-applying layer formed on each widthwise end of the multilayer film, wherein when the magneto-resistive effective device including a multilayer film and the bias mechanism portion are viewed in plane on their own, the uppermost extremity (P1) of the rear end of the magneto-resistive effect device and the uppermost extremity (B1) of the rear end of the bias mechanism portion lie at substantially the same depth-wise position, and the rear slant (BS) of the bias mechanism portion is gentler in gradient than the rear slat (PS) of the magneto-resistive effect device. It is thus possible just only to facilitate the fabrication of the device but also to achieve several advantages of being a lower rate of occurrence of noise, higher reliability and higher yields.

INDUSTRIAL APPLICABILITY

The present invention can have applications to the industry of magnetic disk systems comprising a magneto-resistive effect device adapted to read the signal strength of magnetic recording media as signals.

What we claim is:

1. A thin-film magnetic head comprising a magneto-resistive effect device including a multilayer film in which a fixed magnetization layer, a non-magnetic layer and a free layer stacked together in order, and a bias mechanism portion including a bias magnetic field-applying layer formed on each widthwise end of the multilayer film, characterized in that:
said free layer functions such that a direction of magnetization changes depending on an external magnetic field;
said bias magnetic field-applying layer functions in such a way as to apply a longitudinal magnetic field to said free layer;
said magneto-resistive effect device including a multilayer film extends rearward from an air bearing surface that is a plane opposite to a medium, and is provided at a rear end thereof with a rear slant (PS) that inclines from an uppermost extremity (P1) of the rear end of the device toward a lowermost extremity (P2) of the rear end of the device in a thickness direction;
said bias mechanism portion extends rearward from the air bearing surface that is the plane opposite to the medium, and is provided at a rear end thereof with a rear slant (BS) that inclines from an uppermost extremity (B1) of the rear end of the bias mechanism portion toward a lowermost extremity (B2) of the rear end of the bias mechanism portion in a thickness direction; and
said rear slant (BS) of the bias mechanism portion is gentler in gradient than said rear slant (PS) of said magneto-resistive effect device.

2. The thin-film magnetic head according to claim 1, wherein the rear slant (BS) of the bias mechanism portion is formed such that a thickness (H1) of the bias magnetic field-applying layer found at the same position as a depth-wise position (Y2) at which a lowermost extremity (F2) of the free layer at said rear slant (PS) of the magneto-resistive effect device lies accounts for at least 70% of a total thickness (H0) of the bias mechanism portion.

3. The thin-film magnetic head according to claim 2, wherein when said magneto-resistive effect device including a multilayer film and said bias mechanism portion are viewed in plane, said uppermost extremity (P1) of the rear end of the magneto-resistive effect device and said uppermost extremity (B1) of the rear end of the bias mechanism portion lie at substantially the same depth-wise position.

4. The thin-film magnetic head according to claim 1, wherein when said magneto-resistive effect device including a multilayer film and said bias mechanism portion are viewed in plane, said uppermost extremity (P1) of the rear end of the magneto-resistive effect device and said uppermost extremity (B1) of the rear end of the bias mechanism portion lie at substantially the same depth-wise position.

5. The thin-film magnetic head according to claim 4, wherein the depth-wise position (Y1) of said uppermost extremity (P1) of the rear end of the magneto-resistive effect device, and said uppermost extremity (B1) of the rear end of the bias mechanism portion is in a range of ±3% with respect to a predetermined depth-wise length.

6. The thin-film magnetic head according to claim 1, wherein a condition: Tb−Tp≦13 nm is satisfied, where Tb is a maximum thickness of said bias mechanism portion, and Tp is a thickness of said magneto-resistive effect device.

7. A head gimbal assembly, characterized by comprising:
a slider including a thin-film magnetic head as recited in claim 1 and located in opposition to a recording medium, and
a suspension adapted to resiliently support said slider.

8. A magnetic disk system, characterized by comprising:
a slider including a thin-film magnetic head as recited in claim 1 and located in opposition to a recording medium, and
a positioning means adapted to support and position said slider with respect to said recording medium.

* * * * *